United States Patent [19]

Mazur

[11] 3,777,188

[45] Dec. 4, 1973

[54] LIGHT SENSITIVE GATING OF TRIAL NEAR OR AT ZERO CROSSING POINT

[75] Inventor: Thomas Mazur, Scottsdale, Ariz.

[73] Assignee: Motorola, Inc., Franklin Park, Ill.

[22] Filed: Sept. 15, 1972

[21] Appl. No.: 289,381

[52] U.S. Cl. .................... 307/311, 317/124, 323/21, 323/24, 307/252 UA

[51] Int. Cl. .......................... H03k 19/14, H03k 3/42

[58] Field of Search .................... 323/21, 22 SC, 24, 323/37; 307/311, 252 UA; 250/205; 317/124

[56] References Cited

UNITED STATES PATENTS

| | | | |
|---|---|---|---|
| 3,660,752 | 5/1972 | Pfeffer | 323/21 X |
| 3,360,713 | 12/1967 | Howell | 323/21 X |

OTHER PUBLICATIONS

Electronics, Nov. 23, 1970; Page 68; Article by Van-Zee.

*Primary Examiner*—Gerald Goldberg
*Attorney*—Vincent J. Rauner et al.

[57] ABSTRACT

A light emitting diode is energized by a control voltage and light produced in response to the control voltage illuminates a photo-Darlington pair of transistors which provide a trigger to a triac connected in the load circuit to control current therethrough. Two unidirectional semiconductor switches are connected to the photo-Darlington pair in oppositely poled orientation so as to provide alternate current paths when voltage applied to the photo-Darlington pair exceeds a predetermined voltage in either polarity whereby the photo-Darlington pair is prevented from operating and producing a trigger for the triac.

8 Claims, 1 Drawing Figure

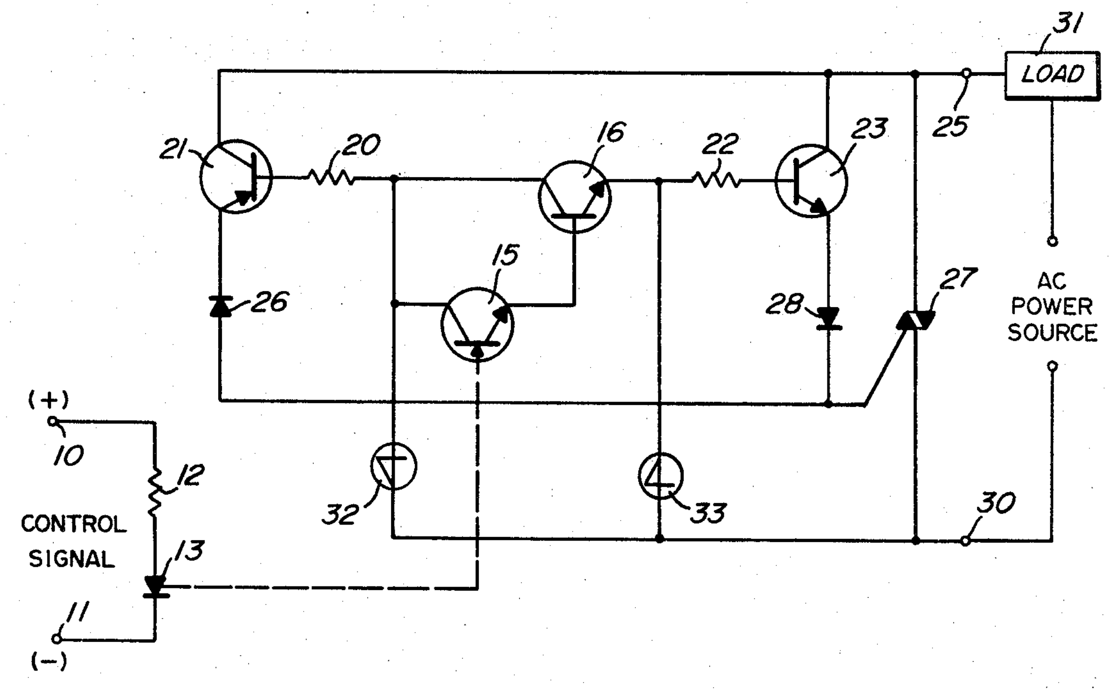
31
LOAD
21
20
16
22
23
25
15
26
28
27
AC
POWER
SOURCE
(+)
10
12
CONTROL
SIGNAL
13
11
(−)
32
33
30

LIGHT SENSITIVE GATING OF TRIAL NEAR OR AT ZERO CROSSING POINT

BACKGROUND OF THE INVENTION

1. Field of the Invention

Much effort has been expended to develop a solid state relay which will operate under substantially any conditions of load and current, similar to the operation of a mechanical relay. A completely solid state relay has the advantages of no moving parts to wear out or become fouled with dirt and corrosion and the further advantage of being relatively small.

2. Description of the Prior Art

Many different prior art solid state relays have been devised which can fulfill the requirements of a relatively high impedance when they are switched off and a relatively low impedance when they are activated or turned on. However, all of these devices are designed to turn on regardless of the amplitude of voltage being applied to the load or the type of load. For example, if an inductive or capacitive load is applied to their prior art relays switching the load current on or off at or near a peak could seriously damage components of the circuit and produce substantial electomagnetic interference. Further, in many instances the control voltage in the prior art systems affects or is effected by the current being controlled. That is, the control and output circuits are interconnected and have at least some minimum effect on each other.

SUMMARY OF THE INVENTION

The present invention pertains to an improved electronic relay wherein a light emitting semiconductor device provides light in response to a control voltage, which light is utilized to control the conduction of a photo-semiconductor device for applying current therethrough to trigger a load current conducting semiconductor device. A pair of unidirectional semiconductor switches are connected to the photo-semiconductor device in oppositely poled relationship to prevent operation of the photo-semiconductor device after the voltage thereacross reaches a predetermined value so that the load current conducting semiconductor device can only be switched on within a predetermined amplitude of the zero crossings of an alternating voltage.

It is an object of the present invention to provide an improved electronic relay.

It is a further object of the present invention to provide an improved solid state relay wherein light is produced by a light emitting semi-conductor device in response to a control voltage and the light controls the switching of load current so that no electrical connection is provided between the control signal and the load current.

It is a further object of the present invention to provide an improved solid state relay which only switches at or near the zero crossings of an AC voltage applied across the load and the relay to minimize electromagnetic interference.

It is a further object of the present invention to provide an improved solid state relay capable of operating in conjunction with substantially any type of load.

These and other objects of this invention will become apparent to those skilled in the art upon consideration of the accompanying specification, claims and drawing.

BRIEF DESCRIPTION OF THE DRAWING

The single FIGURE is a schematic diagram of a solid state relay embodying the present invention.

DESCRIPTION OF THE PREFERRED EMBODIMENT

Referring to the single FIGURE, the numerals 10 and 11 designate positive and negative input terminals adapted to have a control voltage applied thereacross. Terminal 10 is connected through a resistor 12 to an electrode of a light emitting means, which in this embodiment is the anode of a light emitting diode (LED) 13. Terminal 11 is connected to a second terminal of the light emitting means, which in this embodiment is the cathode of the LED 13. The light emitting means may be any device, preferably a semiconductor means, which produces light in response to the control voltage applied to terminals 10 and 11.

The LED 13 is mounted to transmit light to a photo-Darlington pair which includes a photo-transistor 15 and a transistor 16. The emitter of the photo-transistor 15 is connected to the base of the transistor 16 and the collectors are connected together. Collector current in the photo-transistor 15 is produced by light falling thereon indicated by the dotted lines. The common collectors of the photo-transistor 15 and transistor 16 are connected through a resistor 20 to the base electrode of a P-N-P type transistor 21. The emitter of the transistor 16 is connected through a reistor 22 to the base electrode of a N-P-N type transistor 23. The collectors of the transistors 21 and 23 are connected together and to an output terminal 25. The emitter of the transistor 21 is connected to the cathode of a diode 26 the anode of which is connected to the gate electrode of a load current conducting means or thyristor, which in this embodiment is a five-layer semiconductor device such as a triac 27. It should be understood that the load current conducting means might be any of the variety of semiconductor devices commonly known as thyristors and including silicon controlled rectifiers, triacs, etc. The emitter of the transistor 23 is connected to the anode of a diode 28 the cathode of which is connected to the gate electrode of the triac 27. The main current conducting electrodes of the triac 27 are connected between the terminal 25 and a second output terminal 30. In the FIGURE, the terminals 25 and 30 are connected in series with a load 31 across a suitable source of AC power (not shown).

A first breakdown device 32 is connected between the collector of the transistor 16 and the output terminal 30. A second breakdown device 33 is connected between the emitter of the transistor 16 and the output terminal 30 and is poled oppositely to the breakdown device 32. The breakdown devices 32 and 33 may be any device which breaks down and begins to conduct when a voltage having a predetermined amplitude is applied thereacross and which, upon conduction, presents a lower impedance to the flow of current so that the voltage thereacross is substantially below the predetermined or breakdown voltage. Typical breakdown devices are avalanche-type semiconductor devices such as unidirectional semiconductor switches. Gas type discharge tubes and the like might be utilized as breakdown devices but it should be understood that avalanche-type semiconductor devices have the advantage of being small, inexpensive and easy to incorporate into integrated circuits and the like. In the FIGURE, unidirectional semiconductor switches are illustrated with the breakdown device 32 being poled so that a voltage of approximately 8 volts positive causes breakdown and conduction thereof and a voltage of approximately 8 volts negative at the terminal 25 produces breakdown and conduction of the breakdown device 33. When either of the breakdown devices 32 or 33 conduct, the voltage drop thereacross becomes approximately 1 volt.

In the operation of the above described relay, the relay is connected into a desired circuit in any well-known manner, such as by connecting the terminals 25 and 30 in series with the load 31 across a power supply (described above), and the terminals 10 and 11 are connected to a suitable source of control signal or voltage. With no control voltage applied between the terminals 10 and 11, no light is supplied to the photo-transistor 15. Assuming the voltage on the terminal 25 builds up from zero towards the positive peak with respect to the terminal 30, as the voltage at the terminal 25 exceeds approximately 8 volts, the breakdown device 32 conducts through the collector to base junction of the transistor 21 and the resistor 20. The voltage at the collector of the transistor 16, relative to the terminal 30, is approximately 1 volt after the breakdown device 32 conducts. The conduction of the breakdown device 32 lowers the voltage at the collector of the transistor 16 to a value insufficient to supply trigger current to the triac 27. As the terminal 25 begins to go negative relative to the terminal 30, when the voltage exceeds approximately 8 volts, the breakdown device 33 conducts through the resistor 22 and base to collector junction of the transistor 23 and the circuitry is again prevented from providing sufficient trigger current to the triac 27. Thus, the breakdown devices 32 and 33 provide alternate current paths to prevent the light responsive means, or trigger circuitry, from triggering the triac 27 when the voltage thereacross exceeds a predetermined value, in the present circuitry plus or minus 8 volts.

Assuming that a control signal is applied between the terminals 10 and 11 to activate the LED 13 during the time that the voltage between the terminals 25 and 30 is at a zero crossing, the light produced by the LED 13 will allow a collector current in the photo-transistor 15, which current will be amplified by the transistor 16 connected as a Darlington pair with the photo-transistor 15. The collector currents flowing in the transistors 15 and 16 will be available at the bases of the transistors 21 and 23. The transistor 23 is an N-P-N type transistor and, as the potential on the terminal 25 rises positively with respect to the terminal 30, trigger current flows through the transistor 23 and diode 28 to the gate of the triac 27. When the triac 27 conducts, the voltage thereacross drops to approximately 2 volts, in the present embodiment, which disables the trigger circuitry until the next zero crossing period, at which time the triac 27 ceases to conduct.

If the LED 13 remains energized through the next zero crossing period, the potential on the terminal 25 begins to rise negatively with respect to the terminal 30 and the current flowing in the photo-transistor 15 and transistor 16 biases the transistor 21, which is a P-N-P type transistor, into conduction to allow trigger current to flow from the gate of the triac 27 through the diode 26 and the transistor 21. Thus, the triac 27 again conducts and the voltage thereacross drops to approximately 2 volts and the trigger circuitry is disabled until the next zero crossing period.

Thus, a solid state relay is disclosed which operates only when the voltage thereacross is below a predetermined value so that substantially any type of load, such as capacitive or inductive, can be incorporated therewith and the electro-magnetic interference generated thereby will be minimized. Further, operating the relay at or near a zero crossing reduces the danger of damaging components in the relay or circuitry attached thereto. Also, the control signal causes the relay to operate through a light or optical link so that interference or cross coupling between the control signal and the load current is eliminated. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this

I claim:

1. An improved electronic relay comprising:

*a.* light emitting means adapted to have a control voltage applied thereto and provide light in response to said control voltage;

*b.* light responsive means connected to receive light from said light emitting means and operating to provide a trigger signal in response thereto;

*c.* breakdown means connected to said light responsive means for providing an alternate current path when voltage applied to said light responsive means exceeds a predetermined voltage in either polarity to prevent operation of said light responsive means; and

*d.* load current conducting means having first and second electrodes adapted to be connected to a signal to be controlled and a gate electrode coupled to said light responsive means for receiving the trigger signal from said light responsive means upon the operation of said light responsive means.

2. An improved electronic relay as set forth in claim 1 wherein the light emitting semiconductor means includes a light emitting diode.

3. An improved electronic relay as set forth in claim 1 wherein the load current conducting semiconductor means includes a five layer semiconductor device capable of conducting current in either direction therethrough.

4. An improved electronic relay comprising:

*a.* light emitting means adapted to have a control voltage applied thereto and provide light in response to said control voltage;

*b.* light responsive means connected to receive light from said light emitting means and operating to provide a trigger signal in response thereto;

*c.* first and second avalance type semiconductor means connected to said light responsive means and poled oppositely to each other for providing alternate current paths when voltage applied to said light responsive means exceeds a predetermined voltage in either polarity to prevent operation of said light responsive means; and

*d.* load current conducting means having first and second electrodes adapted to be connected to a signal to be controlled and a gate electrode coupled to said light responsive means for receiving the trigger signal from said light responsive means upon the operation of said light responsive means.

5. An improved electronic relay as set forth in claim 4 wherein the light emitting means includes a semiconductor light emitting diode.

6. An improved electronic relay as set forth in claim 4 wherein the light responsive means includes a phototransistor.

7. An improved electronic relay as set forth in claim 4 wherein the first and second avalanche type semiconductor means each include a unidirectional semiconductor switch.

8. An improved electronic relay as set forth in claim 4 wherein the load current conducting means includes a five layer semiconductor device capable of conducting current in either direction therethrough.

* * * * *